United States Patent
Lermer

(10) Patent No.: US 10,271,450 B2
(45) Date of Patent: Apr. 23, 2019

(54) UNIT ARRANGEMENT WITH A 19-INCH FRAME

(71) Applicant: Robert Bosch GmbH, Stuttgart (DE)

(72) Inventor: Franz Lermer, Pilsting-Ganacker (DE)

(73) Assignee: Robert Bosch GmbH, Stuttgart (DE)

(*) Notice: Subject to any disclaimer, the term of this patent is extended or adjusted under 35 U.S.C. 154(b) by 0 days.

(21) Appl. No.: 15/511,564

(22) PCT Filed: Sep. 7, 2015

(86) PCT No.: PCT/EP2015/070317
§ 371 (c)(1),
(2) Date: Mar. 15, 2017

(87) PCT Pub. No.: WO2016/041797
PCT Pub. Date: Mar. 24, 2016

(65) Prior Publication Data
US 2017/0265324 A1 Sep. 14, 2017

(30) Foreign Application Priority Data
Sep. 16, 2014 (DE) .................. 10 2014 218 533

(51) Int. Cl.
*H05K 7/14* (2006.01)
*A47B 47/00* (2006.01)
(Continued)

(52) U.S. Cl.
CPC ....... *H05K 7/1489* (2013.01); *A47B 47/0091* (2013.01); *A47B 87/0207* (2013.01); *A47B 91/04* (2013.01); *H05K 7/1425* (2013.01)

(58) Field of Classification Search
CPC ............... H05K 7/1489; H05K 7/1425; A47B 47/0091; A47B 91/04; A47B 87/0207
See application file for complete search history.

(56) References Cited

U.S. PATENT DOCUMENTS 4,479,561 A * 10/1984 Feinland ............... G01G 23/06
177/154
5,045,971 A * 9/1991 Ono ..................... H04B 1/034
361/704
(Continued)

FOREIGN PATENT DOCUMENTS

EP        1565048        8/2005

OTHER PUBLICATIONS

International Search Report for Application No. PCT/EP2015/070317 dated Dec. 4, 2015 (English Translation, 2 pages).

*Primary Examiner* — Ko H Chan
(74) *Attorney, Agent, or Firm* — Michael Best & Friedrich LLP

(57) ABSTRACT

Electrical and electronic devices are often installed in socalled racks. Racks of this type are shelf-like frames into which the devices are inserted and can be fastened, for example by means of screws. The racks commonly provide a pair of support rails for each device, upon which rails the device can be placed and can be inserted into the rack. The device can be subsequently fixed to the rack, for example screwed in. Within the scope of the invention, a device arrangement (1) is disclosed comprising at least one stacking device (4), wherein the stacking device (4) has adjustable feet (15) on the bottom surface (11) for supporting on a placement surface, comprising a base device (3), wherein the at least one stacking device (4) is arranged on the base device (3) so that these form a device tower (13), wherein the adjustment feet (15) of the stacking device (4) stand on the base device (3), wherein the device arrangement (1) comprises a 19-inch frame (2) and the stacking device (4) and the base device (3) are designed as insert devices with front plates (6) for the 19-inch frame (2), wherein the base device (3) and the at least one stacking device (4) are (Continued)

arranged as a device tower (13) in the 19-inch frame (2), and wherein the front plates (6) are connected to the 19-inch frame (2).

16 Claims, 1 Drawing Sheet

(51) Int. Cl.
 *A47B 87/02* (2006.01)
 *A47B 91/04* (2006.01)

(56) References Cited

U.S. PATENT DOCUMENTS

| | | | | |
|---|---|---|---|---|
| 5,227,957 A * | 7/1993 | Deters | G06F 1/181 | 312/223.2 |
| 5,332,182 A * | 7/1994 | Weisz | F16M 7/00 | 248/188.4 |
| 5,348,268 A * | 9/1994 | Klein | A61B 5/0444 | 248/222.11 |
| 5,992,953 A * | 11/1999 | Rabinovitz | A47B 87/02 | 312/111 |
| 6,255,583 B1 * | 7/2001 | Johnson | H05K 5/0234 | 174/363 |
| 6,496,366 B1 * | 12/2002 | Coglitore | G06F 1/18 | 174/377 |
| 6,698,851 B1 * | 3/2004 | Ludl | H05K 5/0021 | 312/108 |
| 7,239,509 B1 * | 7/2007 | Roeske | G06F 1/1632 | 361/679.02 |
| 7,307,834 B2 * | 12/2007 | Jones | G06F 1/181 | 361/679.55 |
| 8,169,777 B2 * | 5/2012 | Huang | G06F 1/181 | 248/223.31 |
| 9,416,483 B1 * | 8/2016 | Freakes | D06F 39/125 | |
| 9,591,783 B2 * | 3/2017 | Korikawa | H05K 5/0021 | |
| 9,615,487 B2 * | 4/2017 | Elwany | | |
| 2003/0007321 A1 * | 1/2003 | Dayley | G06F 1/181 | 361/679.6 |
| 2010/0321874 A1 * | 12/2010 | Bhattacharyya | H05K 7/20736 | 361/679.5 |

* cited by examiner

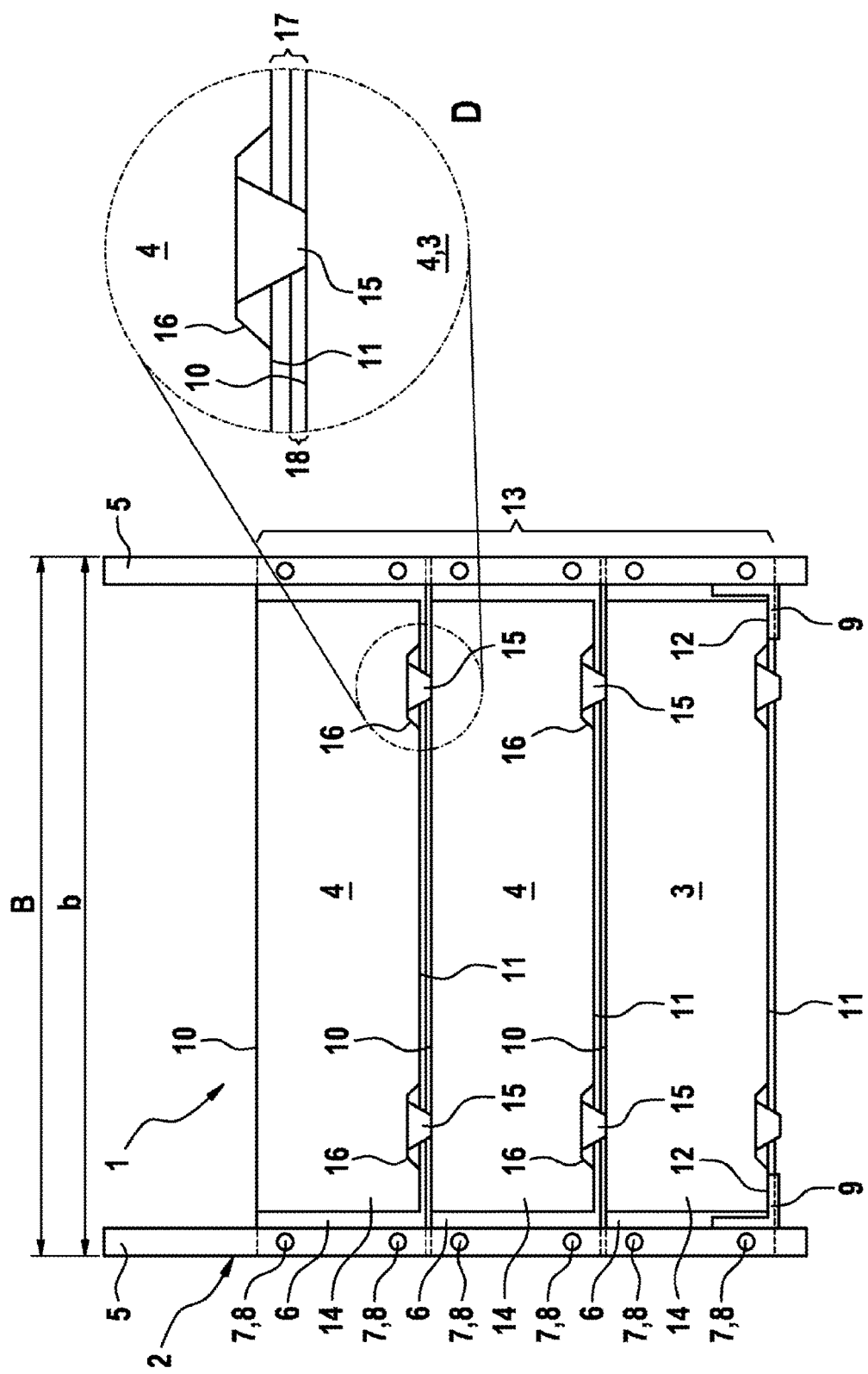

UNIT ARRANGEMENT WITH A 19-INCH FRAME

BACKGROUND OF THE INVENTION

The invention relates to a unit arrangement having at least one stacking unit, wherein, on the bottom side, the stacking unit has positioning feet for bearing on a positioning surface, and having a base unit, wherein the at least one stacking unit is arranged on the base unit, and these therefore form a unit tower, wherein the positioning feet of the stacking unit stand on the base unit.

Electrical and electronic units are often installed in so-called racks. Such racks are shelf-like frames, in which the units can be mounted and fastened, for example, by means of screws. It is usually the case that, for each unit, the racks have a pair of bearing rails, on which the unit can be placed in position and mounted in the rack. The unit can then be fastened on the rack, for example screwed to the same.

EP 15650 48 A1, which forms probably the closest prior art, discloses a housing for accommodating electrical components, wherein, on the underside, the housing has feet in order for the unit to be positioned on a second, identical housing. Furthermore, on the upper side, the housing has mounts for the feet, and this allows the latter to be accommodated in a state in which they are secured against displacement. The housings with the electrical components can be stacked one upon the other as required.

SUMMARY OF THE INVENTION

The invention proposes a unit arrangement as can be used, for example, in laboratories, in control engineering, in a computer center or in a music system, in particular in a PA system.

The unit arrangement has at least one stacking unit. A unit body of the stacking unit is preferably cuboidal. On the bottom side, in particular on the underside, the stacking unit has positioning feet for bearing on a positioning surface.

The unit arrangement also comprises a base unit. A unit body of the base unit is preferably cuboidal. The at least one stacking unit and the base unit preferably have the same housing dimensions. The stacking unit and the base unit are designed in the form of electronic and/or electrical units. For example, the stacking unit and/or the base unit may constitute an amplifier, a network device, a display unit, etc.

The stacking unit is arranged on the base unit, and these therefore form a unit tower. Provision is made here, in particular, for the positioning feet of the stacking unit to stand on the base unit. As an option, it is possible for the at least one stacking unit to have further stacking units arranged on it.

The invention proposes that the unit arrangement should comprise a 19-inch frame. The 19-inch frame is also referred to in the art as a 19-inch rack and forms a chassis for the base unit and the at least one stacking unit. The 19-inch frame is made up preferably of metal profiles, in particular steel profiles, and has, for example, four vertically running corner profiles and a plurality of horizontally running supporting profiles.

The 19-inch frame is dimensioned such that it can accommodate a front panel with a width of precisely 48.26 centimeters, that is to say of 19 inches. In particular, the 19-inch frame is designed for accommodating units with a standard width of 19 inches. The standardization can be taken from EIA 310 D, IEC 60297 and/or DIN 41494 SC48D.

The invention also proposes that the at least one stacking unit and the base unit should be designed in the form of rack-mounting units for a, or the, 19-inch frame, wherein the base unit and the stacking unit each have a front panel with the width of 19 inches (48.26 centimeters). The front panels of the base unit and of the stacking unit are connected to the 19-inch frame, for example they are screwed thereto, it also being possible, as an alternative, to use quick-fit connections. Provision is made for the base unit and the at least one stacking unit to be arranged in the form of the unit tower in the 19-inch frame. In the unit arrangement, the stacking unit is supported via the positioning feet, in particular directly, on the base unit.

As an example, the stacking unit has four positioning feet, which are designed in the form of corner points in an imaginary rectangle or square and/or define a rectangle or square. As an alternative, it would also be possible to use, for example, just rear positioning feet, in particular two rear positioning feet. In this case, the stacking unit, at the front, is screwed to the front panel in the 19-inch frame and, at the rear, rests on the base unit via the positioning feet. The rear bearing means relieves the front panel of force-related loading, which in many cases, especially in the case of relatively lightweight units, will be sufficient. In the case of heavy units, preferably front and rear positioning feet, in particular four positioning feet are installed.

Fastening and positioning of the stacking unit therefore takes place, on the one hand, at the front via the connection between the front panel of the stacking unit and the 19-inch frame and, on the other hand, via the positioning feet on the base unit. The unit arrangement according to the invention is thus taking a new approach to arranging rack-mounting units in 19-inch frames: up until now, it was customary for carrying rails to be provided for each rack-mounting unit in a 19-inch frame, and therefore the rack-mounting unit, on the one hand, had a bottom side supported on the carrier bars and, on the other hand, was connected up to the 19-inch frame at the front via the front panel. The prior-art arrangement, however, has the disadvantage that a dedicated pair of carrying rails has to be installed in the 19-inch frame for each rack-mounting unit. This results firstly in an increased amount of work required for installing the carrying rails, secondly in an increase in the weight of the unit arrangement as a result of the carrying rails, and thirdly in increased costs, likewise as a result of the carrying rails.

In contrast, the invention proposes that the stacking units, rather than being supported vertically on carrying rails, should be supported vertically on another rack-mounting unit, in this case on the base unit or other stacking units. This novel arrangement has the advantage that it is possible to dispense with a set of carrying rails between the base unit and the stacking unit, and it is therefore possible to cut back on the amount of work required, the amount of material used and also weight.

In a preferred configuration of the invention, the stacking unit has recessed regions, in which the positioning feet are arranged. It is particularly preferred for the positioning feet to be formed from an elastic material, for example from plastics material or from rubber. The positioning feet in particular achieve the situation where the stacking unit and the base unit are decoupled mechanically from one another. However, arranging the positioning feet between the stacking unit and base unit without taking any further measures would mean that an intermediate gap between the stacking unit and base unit would have to be very large in order for the positioning feet to have sufficient height and/or stability. Against this background, the invention proposes a preferred configuration in which the positioning feet are arranged in a recessed manner in the stacking unit. It is thus possible for the positioning feet to have a sufficient height, but for the intermediate gap to have small dimensions, since said gap is defined only by a projection of the positioning feet beyond the bottom surface of the bottom side of the stacking unit. This preferred configuration therefore ensures sufficient mechanical decoupling on account of a large height or axial length of the positioning feet and, at the same time, the dimensions of the intermediate gap are very small on account of the recessed regions. Provision may be made, for example, for more than 40 percent of the overall height of the positioning feet, preferably more than 60 percent of the height of the positioning feet and in particular more than 80 percent of the height of the positioning feet, to be recessed in the stacking unit, the projection beyond the bottom surface therefore being smaller than 60 percent of the overall height of the positioning feet, preferably smaller than 40 percent of the overall height of the positioning feet and in particular smaller than 20 percent of the overall height of the positioning feet.

From a production point of view, it is preferred for the stacking unit to have a metal baseplate, wherein the recessed regions are designed in the form of stamped regions in the metal baseplate. In this configuration, the recessed regions can be produced in a cost-effective manner and, in addition, increase the rigidity of the metal baseplate.

It is particularly preferred for the positioning feet to project beyond the bottom surface of the stacking unit. It is thus possible for the stacking unit, for example as it is being mounted in the 19-inch frame, to rest on the base unit and to be pushed over the base unit without the bottom surface of the stacking unit scratching the top surface of the base unit. This solution has particular advantages when the stacking unit is being pulled out of the ready installed 19-inch frame, e.g. for servicing purposes. For mounting purposes, the units are normally stacked from the bottom upward. If the 19-inch frame, however, has been definitively installed and units have to be changed over, it is usually the case that a unit is "wedged in" between lower and upper neighboring units. The positioning feet reduce the number of bearing surfaces and achieve a sliding action, and therefore it is also possible for individual units to be pulled out, and also mounted again afterward, without the 19-inch frame being completely dismantled. For the case where a stacking unit which is to be pulled out has another stacking unit standing on it, the stacking unit installed above can be supported on the unit beneath, in particular stacking unit or base unit, e.g. on the rear side by a spacer. As a result, the stacking unit installed above, rather than just being fastened on the 19-inch frame via the front panel, can be supported via the spacer and the front panel. This also means that the installation space, or stacking space, is maintained for subsequent mounting of the stacking unit which has been removed.

At the same time, it is preferred for the positioning feet to be dimensioned such that, in the installed state, that is to say under loading, they establish a spacing between the stacking unit and the base unit or, in the case of further stacking units, between the stacking units such that a desired or predetermined spacing measurement is obtained between the front panels. This design development is based on the consideration that a spacing between the base unit and stacking unit is obtained, firstly, by the intermediate gap between the bottom surface of the stacking unit and the top surface of the base unit and, secondly, by the spacing measurement between the front panel of the base unit and the front panel of the stacking unit. As a result of the configuration described, the stacking unit is arranged on the base unit via the positioning feet such that the front panel of the stacking unit is suitable for stress-free fastening on the 19-inch frame. The spacing measurement between the front panels can also be reduced to 0 mm, and therefore the front panels are arranged in contact, but in a state in which they are fully or at least partially relieved of loading.

In the case of a preferred development, mechanical interfaces are arranged in the front panels so as to be compatible with the predetermined unit spacing in the 19-inch frame, and therefore the front panels of the base unit and stacking unit are arranged in a gap-free manner, that is to say with a spacing measurement of 0 mm, or in a more or less gap-free manner, where the spacing measurement assumes a value of $\frac{1}{32}$ inches, that is to say approximately 0.79 millimeters. This means that the positioning feet and the front panels, and the relative position thereof, are ready for standardized installation in the 19-inch frame.

In order to highlight the concept of the invention further, it is claimed that the positioning feet stand on a top surface of the top side of the base unit, which forms a positioning surface. In particular, the top surface of the base unit is formed by a metal coverplate.

In the case of a preferred development of the invention, the unit tower has further stacking units, which are stacked on the abovedescribed stacking unit. The abovedescribed stacking unit thus forms the base unit for the stacking unit standing on it. In particular, as far as the configuration of the top surface, of the top side or of the metal coverplate and/or of the front panel is concerned, the upper side of the stacking unit is identical to the configuration of the abovedescribed base unit. A possible development of the invention makes provision for the base unit to be designed in the form of a stacking unit.

In the case of a possible configuration, the 19-inch frame has carrying bars extending in a horizontal direction. The carrying bars are designed preferably in the form of L profiles. The base unit is arranged on the carrying bars of the 19-inch frame and is supported in the vertical direction, particularly preferably via a peripheral region, on the carrying bars.

In the case of a preferred realization of the invention, the gap dimension for the intermediate gap between the stacking units and/or between one of the stacking units and the base unit is equal to, or smaller than, the material thickness of the carrying bars, on which the base unit is positioned. This aspect highlights the idea that using the positioning feet instead of the carrying bars, firstly, can cut back on the amount of material used and, secondly, can even optionally increase the amount of installation space available in the heightwise direction for each rack-mounting unit or stacking unit.

BRIEF DESCRIPTION OF THE DRAWINGS

Further features, advantages and effects of the invention can be gathered from the following description of a preferred exemplary embodiment of the invention and from the accompanying FIGURE, in which:

FIG. 1 shows a schematic view from the rear side of a unit arrangement forming an exemplary embodiment of the invention.

DETAILED DESCRIPTION

FIG. 1 shows a schematic plan view as seen from a rear side of a unit arrangement 1 forming an exemplary embodiment of the invention. FIG. 1 also shows a detail D of the unit arrangement 1.

The unit arrangement 1 has a 19-inch frame 2, in which a base unit 3 and two stacking units 4 are arranged. The unit arrangement may be designed, for example, in the form of a server cabinet, a laboratory cabinet, a control cabinet, etc.

The base unit 3 and the stacking unit 4 are each designed in the form of 19-inch rack-mounting units and have a cuboidal unit body 14 and a front panel 6. The front panel 6 is arranged in an upright manner and covers a front side of the cuboidal unit body 14. At the sides, the front panel 6 projects beyond both sides of the unit body 14.

The 19-inch frame 2 exhibits a shelf or rack construction and comprises four corner profiles 5, of which only two are evident from the plan view. The corner profiles 5 are arranged vertically and define a rectangular or square surface area. A width B of the 19-inch frame 2 is dimensioned such that the front panel 6 with a width b of 19 inches can be placed in position in a precisely fitting manner. In this example, the width B, measured as the outer width of the 19-inch frame 2, is likewise precisely 19 inches.

First mechanical interfaces 7 are distributed vertically, in the corner posts 5 of the 19-inch frame 2 in the form of through-openings in a unit spacing appropriate for 19-inch frames. For example, three first mechanical interfaces 7 each spaced apart by 0.625 inches are distributed over a region of 1.75 inches such that the vertical spacing between the centers of the three first mechanical interfaces 7 is 1.25 inches.

The front panels 6 carry second mechanical interfaces 8, for example through-openings, which are adapted to the unit spacing of the first mechanical interfaces 7 such that the second mechanical interfaces 8 coincide with the first mechanical interfaces 7. The first mechanical interfaces 7 have a center-to-center spacing in horizontal direction 18 of $\frac{5}{16}$ inches (465.14 millimeters).

The base unit 3 stands on two carrying rails 9, which in the plan view shown have an L-shaped cross section, the base unit 3 resting on a horizontal limb of the carrying rails 9.

The base unit 3 and the stacking units 4 each have a top side 10 and a bottom side 11. The top side 10 is arranged in each case at the same height as, and/or in alignment with, the upper edge of the front panel 6. In particular, the top side 10 terminates flush with the upper edge of the front panel 6. It would also be possible for the top side 10 to be somewhat lower than the front panel 6, in which case the front panel 6 projects to a slight extent, e.g. by less than 1 mm. The bottom side 11 is set back heightwise in relation to the lower edge of the front panel 6, and therefore, in relation to the bottom side 11, the front panel 6 projects beyond the entire width of the unit, or forms a skirt, in a peripheral region 12.

The base unit 3 has its bottom side 11 resting, in a peripheral region 12, on the upper side of the carrying profiles 9. In the plan view shown, the carrying profiles 9 and the peripheral region 12 are arranged in an overlapping manner.

The stacking units 4 are arranged on the base unit 3 in a unit tower 13, a first stacking unit 4 therefore being arranged on the base unit 3 and a further stacking unit 4 being arranged on the first stacking unit 4.

The stacking units 4 have positioning feet 15, which are arranged on the bottom side 11, in particular underside. The positioning feet 15 can be screwed to the stacking unit 4 or connected integrally thereto. The positioning feet 15 are of frustoconical design, wherein the large diameter is arranged on the stacking unit 4 and the small diameter stands on the base unit 3 or, in the case of the upper stacking unit 4, stands on the central stacking unit 4. As an alternative to this, it is also possible for the positioning feet 15 to be of cylindrical design or to be cylindrical with rounding at the positioning surface. The positioning feet 15 are arranged in recessed regions 16, which are designed in the form of stamped regions in a metal baseplate, which forms the bottom side 11. As far as a height of the positioning feet 15 is concerned, at least 25 percent, preferably at least 40 percent, of the height of the positioning feet 15 is recessed in the recessed regions 16, and therefore it is only the remaining part of the positioning feet 15 which projects out. For example, the height of the positioning feet 15 is 5.5 mm, with the recessed depth being 2 mm, in which case the spacing between the bottom side of the stacking unit 4 and the upper side of the unit arranged below it is 2 mm.

The overall length of the positioning feet 15 is dimensioned such that, in the loaded state shown, said positioning feet bridge the spacing between the bottom side 11 and the top side 10 of the unit located beneath, in particular the stacking unit 4 or base unit 3.

The recessed regions 16 ensure a sufficient axial length or height for the positioning feet 15, and it is therefore the case that, on the one hand, these keep an intermediate gap 17 between the bottom side 11 and the top side 10 small and, at the same time, can provide for a sufficient amount of resilient deflection for the mechanical decoupling of the units 3, 4. In particular, the positioning feet 15 and the recessed regions 16 are coordinated with one another such that the front panel 6 can be screwed to the corner profiles 5 in a tilt-free manner. As an option, provision may be made for a spacing measurement 18 to be established between the front panels 6, which, in accordance with different requirements, should be equal to, or greater than, 0 mm and smaller than 1 mm.

What is claimed is:

1. A unit arrangement (1) comprising
    at least one stacking unit (4) having a housing with a top wall (10), a bottom wall (11), and side walls extending between the top and bottom walls, wherein positioning feet (15) extend downward from the bottom wall (11) within recessed regions (16) formed along the bottom wall (11);
    a base unit (3) with a top wall (10), wherein the at least one stacking unit (4) is arranged on the base unit (3), and the base unit and the at least one stacking unit form a unit tower (13), wherein the positioning feet (15) of the at least one stacking unit (4) stand on the base unit (3); and
    a frame (2), wherein the base unit (3) and the at least one stacking unit (4) are arranged in the form of the unit tower (13) in the frame (2),
    wherein the stacking unit (4) further includes a front panel (6) coupled to the housing, wherein each of the feet (15) extends below the front panel (6), wherein a first gap (17) is defined between the bottom wall (11) of the stacking unit (4) and the top wall (10) of the base unit (3), and wherein a second gap (18) is defined between a bottom of the front panel (6) and the top wall (10) of the base unit (3), wherein the first gap (17) is larger than the second gap (18), and wherein the positioning feet extend across both the first gap (17) and the second gap (18) and rest on the top wall (10) of the base unit (3).

2. The unit arrangement (1) as claimed in claim 1, characterized in that the recessed regions (16) are stamped regions.

3. The unit arrangement (1) according to claim 1, characterized in that the positioning feet (15) are formed from an elastic material.

4. The unit arrangement (1) as claimed in claim 1, characterized in that the at least one stacking unit (4) includes multiple stacking units (4), wherein housings of the stacking units (4) are of identical design.

5. The unit arrangement (1) as claimed in claim 1, characterized in that the base unit (3) has a same shape as the at least one stacking unit (4).

6. The unit arrangement (1) as claimed in claim 1, characterized in that the base unit (3) is arranged on carrying rails (9) of the frame (2).

7. The unit arrangement (1) as claimed in claim 6, characterized in that the at least one stacking unit (4) includes multiple stacking units (4), wherein the first gap (17) is equal to, or smaller than, a thickness of one of the carrying rails (9).

8. The unit arrangement (1) as claimed in claim 6, characterized in that the at least one stacking unit (4) includes multiple stacking units (4), wherein a gap (17) between each of the stacking units (4) is equal to, or smaller than, a thickness of one of the carrying rails (9).

9. The unit arrangement (1) according to claim 1, wherein portions of the feet (15) extend out of the recessed regions.

10. The unit arrangement (1) according to claim 9, wherein each of the recessed regions has a trapezoidal profile.

11. The unit arrangement (1) according to claim 1, wherein each of the feet (15) has a trapezoidal profile.

12. The unit arrangement (1) according to claim 1, wherein the front panel (6) includes first through-openings (8).

13. The unit arrangement (1) according to claim 1, wherein a portion of the front panel (6) extends downward from the bottom wall (11).

14. The unit arrangement (1) according to claim 1, wherein the frame includes corner posts (5) having second through-openings (7), each of the second through-openings being aligned with a respective one of the first through-openings (8) of the at least one stacking unit (4), and wherein the entire at least one stacking unit (4) is fastened in place onto the frame via fasteners, each of the fasteners extending through an aligned pair of the first and second through-openings (7, 8).

15. The unit arrangement (1) according to claim 1, wherein the frame is a 19 inch frame.

16. The unit arrangement (1) according to claim 1, wherein the positioning feet are fixed to the housing.

* * * * *